United States Patent
Cho

(10) Patent No.: US 8,907,551 B2
(45) Date of Patent: *Dec. 9, 2014

(54) LIGHT EMITTING DEVICE PACKAGE

(71) Applicant: LG Innotek Co., Ltd., Seoul (KR)

(72) Inventor: Bum Chul Cho, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/043,502

(22) Filed: Oct. 1, 2013

(65) Prior Publication Data

US 2014/0055981 A1 Feb. 27, 2014

Related U.S. Application Data

(63) Continuation of application No. 13/719,666, filed on Dec. 19, 2012, now Pat. No. 8,569,770, which is a continuation of application No. 12/709,973, filed on Feb. 22, 2010, now Pat. No. 8,358,054.

(30) Foreign Application Priority Data

Feb. 23, 2009 (KR) .................. 10-2009-0014789

(51) Int. Cl.
*F21V 29/00* (2006.01)
*F21V 9/16* (2006.01)
*H01L 33/64* (2010.01)
*H01L 33/40* (2010.01)
*H01L 33/48* (2010.01)

(52) U.S. Cl.
CPC ............. *F21V 29/22* (2013.01); *H01L 33/642* (2013.01); *H01L 2924/0002* (2013.01); *F21V 9/16* (2013.01); *H01L 33/40* (2013.01); *H01L 33/486* (2013.01)
USPC .............. 313/46; 313/483; 313/485; 362/373

(58) Field of Classification Search
CPC .................................. F21V 9/16; F21V 29/002
USPC .............................. 313/46, 483, 485; 362/373
See application file for complete search history.

(56) References Cited

U.S. PATENT DOCUMENTS 7,547,923 B2 * 6/2009 Shin et al. ..................... 257/99
2006/0214178 A1 9/2006 Choi et al.
(Continued)

FOREIGN PATENT DOCUMENTS

CN 1795567 6/2006
CN 101322254 A 12/2008
(Continued)

OTHER PUBLICATIONS

"Semiconductor Wafer, Inc.", http://web.archive.org/web/20050311074813/http://www.semiwafer.com/products/silicon.htm, Semiconductor Wafer, Inc., Mar. 11, 2005.

(Continued)

*Primary Examiner* — Anh Mai
*Assistant Examiner* — Elmito Breval
(74) *Attorney, Agent, or Firm* — Birch, Stewart, Kolasch & Birch, LLP

(57) ABSTRACT

A light emitting device package including a substrate; a light emitting device on the substrate; a first heatsink between the substrate and the light emitting device to transfer heat generated from the light emitting device; a second heatsink disposed below the first heatsink; and an electrode between the first heat sink and the light emitting device. Further, the substrate is disposed between the first and second heatsinks and is narrower at a position between the first and second heatsinks than at a position not between the first and second heatsinks, a material of the substrate is the same at the position between the first and second heatsinks as not between the first and second heatsinks, and the substrate at the position not between the first and second heatsinks surrounds the first and second heat sinks.

20 Claims, 3 Drawing Sheets

(56) References Cited

U.S. PATENT DOCUMENTS

| | | |
|---|---|---|
| 2006/0220036 A1 | 10/2006 | Lee et al. |
| 2007/0007540 A1 | 1/2007 | Hashimoto et al. |
| 2007/0200131 A1 | 8/2007 | Kim |
| 2008/0099770 A1 | 5/2008 | Mendendorp et al. |
| 2009/0001392 A1 | 1/2009 | Lee |
| 2009/0023234 A1 | 1/2009 | Hsu et al. |
| 2009/0039382 A1 | 2/2009 | Su |
| 2010/0181582 A1* | 7/2010 | Li et al. .................. 257/91 |

FOREIGN PATENT DOCUMENTS

| | | |
|---|---|---|
| EP | 2 023 699 A2 | 2/2009 |
| KR | 10-2006-0080336 A | 7/2006 |
| KR | 10-0616680 B1 | 8/2006 |
| KR | 10-0746783 B1 | 7/2007 |
| KR | 10-0788931 B1 | 12/2007 |
| WO | WO 2007/049938 A1 | 5/2007 |
| WO | WO 2008/078900 A1 | 7/2008 |

OTHER PUBLICATIONS

English Translation of CN 1795567, Jun. 28, 2006.
English translation of KR 10-0616680, Aug. 21, 2006.
English translation of KR 10-0788931, Dec. 27, 2007.
Enlish Translation of KR 10-2006-0080336, Jul. 10, 2006.

* cited by examiner

LIGHT EMITTING DEVICE PACKAGE

CROSS-REFERENCE TO RELATED APPLICATIONS

This application is a Continuation of prior pending application Ser. No. 13/719,666, filed on Dec. 19, 2012, and a Continuation of prior pending application Ser. No. 12/709,973, filed on Feb. 22, 2010, which claims priority under 35 U.S.C. §119(e) to Korean Patent Application No. 10-2009-0014789, filed on Feb. 23, 2009. The entire contents of the above applications is hereby incorporated by reference in its entirety.

BACKGROUND

Embodiments relate to a light emitting device package and a method of manufacturing the same.

A light emitting diode (LED) has been widely used as a light emitting device.

The LED includes a first conductive type semiconductor layer, an active layer, and a second conductive type semiconductor layer, which are sequentially stacked on each other so that light generated from the active layer is emitted to the outside according to a voltage applied thereto.

A light emitting device package may have a structure in which a light emitting device is disposed on a silicon (Si) substrate. Since the Si substrate has a high thermal resistance, a thermal emission characteristic may be inferior, and also, a light emission characteristic of the light emitting device may be degraded.

SUMMARY

Embodiments provide a light emitting device package having a novel structure and a method of manufacturing the same.

Embodiments also provide a light emitting device package having an improved thermal emission characteristic and a method of manufacturing the same.

In one embodiment, a light emitting device package comprises: a substrate; a light emitting device on the substrate; a first heatsink between the substrate and the light emitting device, the first heatsink being at least partially disposed within the substrate to transfer heat generated from the light emitting device; first and second electrodes electrically separated from each other, the first and second electrodes being electrically connected to the light emitting device.

In another embodiment, a light emitting device package comprises: a substrate comprising a cavity; a light emitting device within the cavity; a first heatsink between the light emitting device and the substrate; and first and second electrodes electrically separated from each other, the first and second electrodes being electrically connected to the light emitting device.

In further another embodiment, a light emitting device package comprises: a substrate; a light emitting device on the substrate; a heatsink disposed below the light emitting device with the substrate therebetween, the heatsink being at least partially buried in a lower portion of the substrate; and first and second electrodes electrically separated from each other, the first and second electrodes being electrically connected to the light emitting device.

The details of one or more embodiments are set forth in the accompanying drawings and the description below. Other features will be apparent from the description and drawings, and from the claims.

DETAILED DESCRIPTION OF THE EMBODIMENTS

Figure 1:
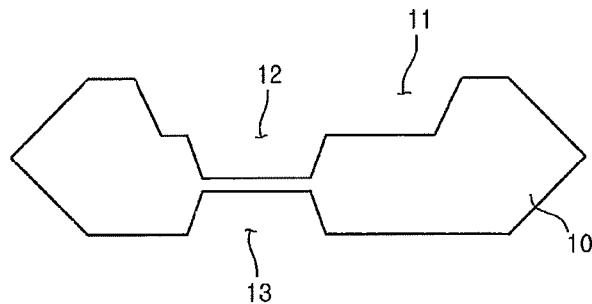
FIGS. 1 to 5 are views of a light emitting device and a method of manufacturing the light emitting device according to an embodiment.

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. Reference will now be made in detail to the embodiments of the present disclosure, examples of which are illustrated in the accompanying drawings. In the following description, words "above," "one," "below," and "underneath" are based on the accompanying drawings.

In the drawings, the thickness or size of each layer is exaggerated, omitted, or schematically illustrated for convenience in description and clarity. Also, the size of each element does not entirely reflect an actual size.

Hereinafter, a light emitting device package and a method of manufacturing the same according to an embodiment will be described in detail with reference to accompanying drawings.

Figure 4:
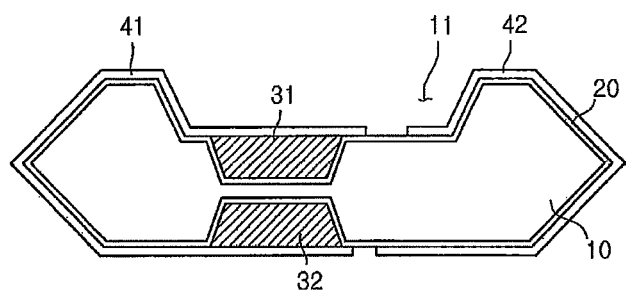
Figure 5:
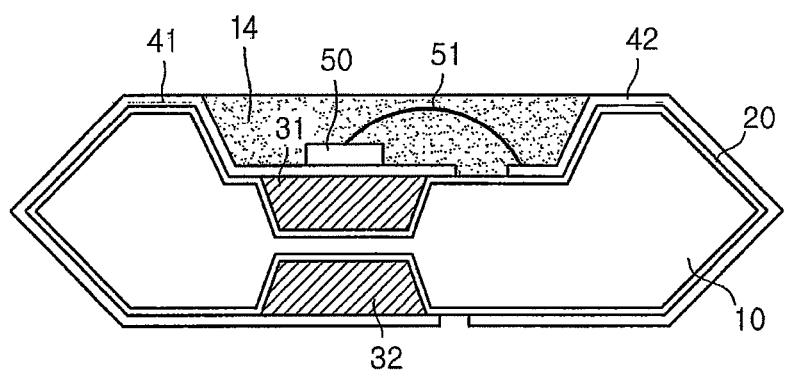
Figure 6:
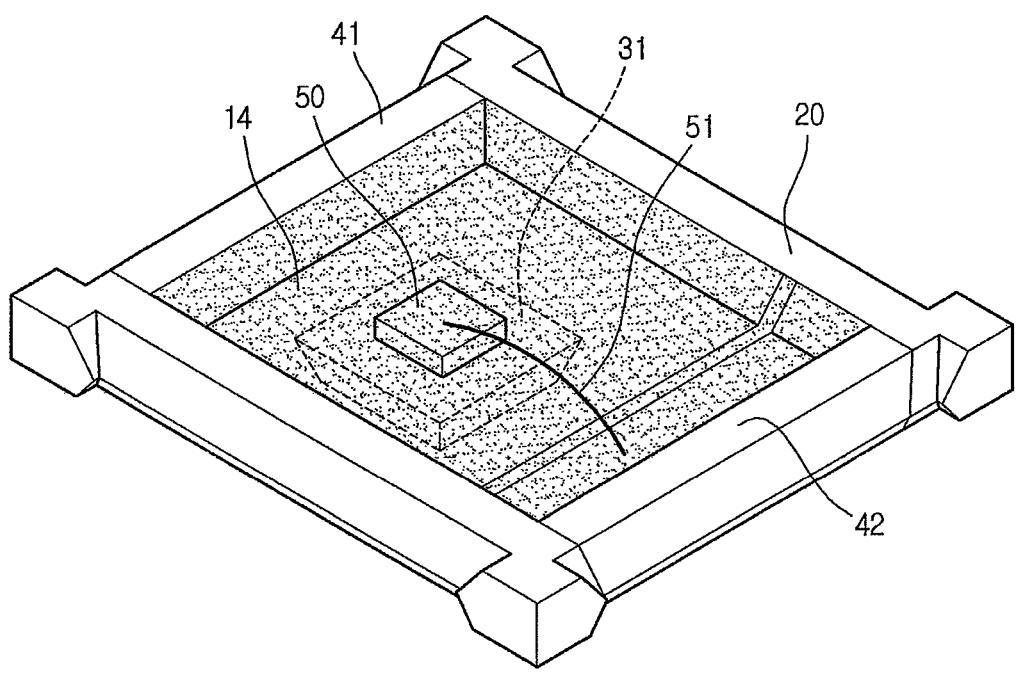
FIG. 6 is a perspective view of a light emitting device according to an embodiment.

FIGS. 1 to 5 are views of a light emitting device and a method of manufacturing the light emitting device according to an embodiment, and FIG. 6 is a perspective view of a light emitting device according to an embodiment.

Referring to FIGS. 5 and 6, a light emitting device package includes a substrate 10, an insulating layer 20 disposed on the substrate 10, a first heatsink 31 disposed on an upper portion of the substrate 10, a second heatsink 32 disposed on a lower portion of the substrate 10, first and second electrodes 41 and 42 disposed on the substrate 10 and electrically separated from each other, and a light emitting device 50 electrically connected to the first and second electrodes 41 and 42.

The substrate 10 may be formed of a conductive material or an insulating material. The insulating layer 20 electrically insulates the substrate 10. For example, the substrate 10 may be formed of Si material that is the insulating material. The insulating layer 20 may be disposed on a surface of the substrate 10 to prevent current from leaking. The insulating layer 20 may include a Si oxide layer in which a substrate formed of the Si material is oxidized.

A first cavity (see reference numeral 11 of FIG. 1) is defined in a top surface of the substrate 10. A second cavity (see reference numeral 12 of FIG. 1) is defined within the first cavity 11. The first heatsink 31 is buried within at least a portion of the second cavity 12.

A third cavity (see reference numeral 13 of FIG. 1) is defined in a bottom surface of the substrate 10. The second heatsink 32 is buried within at least a portion of the third cavity 13. For example, a top surface of the first heatsink 31 may flush with a top surface of the insulating layer 20 disposed on a bottom surface of the first cavity 11. A bottom surface of the second heatsink 32 may flush with a bottom surface of the insulating layer 20 disposed on a bottom surface of the substrate 10.

For example, the first and second heatsinks 31 and 32 may be formed of copper (Cu) or aluminium (Al) having a superior thermal conductivity, but is not limited thereto.

The first and second heatsinks 31 and 32 are disposed at positions corresponding to each other. That is, the first and second heatsinks 31 and 32 vertically overlap each other. Thus, heat may be effectively transferred from the first heatsink 31 to the second heatsink 32. Also, only one of the first and second heatsinks 31 and 32 may be provided.

The substrate 10 may have a thickness of 400 µm to 800 µm. The substrate 10 disposed below the first heatsink 31 may have a thickness of 10 µm to 20 µm. That is, when all of the first and second heatsinks 31 and 32 is provided, the substrate 10 between the first heatsink 31 and the second heatsink 32 may have a thickness of 10 µm to 20 µm. For example, the substrate 10 disposed below the first heatsink 31 may have a thickness corresponding to 1.25% to 5% of a maximum thickness of the substrate 10.

The substrate 10 between the first heatsink 31 and the second heatsink 32 may not be completely removed, but partially remain. Thus, when the first and second heatsinks 31 and 32 are buried into the first and second cavities 12 and 13, it may prevent a void from occurring.

The first and second electrodes 41 and 42 may extend from the bottom surface of the substrate 10 to the top surface of the substrate 10 along lateral surfaces of the substrate 10. Also, the first and second electrodes 41 and 42 may pass through the substrate to extend from the bottom surface of the substrate 10 to the top surface of the substrate 10.

The first and second electrodes 41 and 42 may be disposed on the insulating layer 20. The first electrode 41 may extend up to the first heatsink 31.

In this embodiment, the first electrode 41 may vertically overlap the first and second heatsinks 31 and 32 or cover surfaces of the first and second heatsinks 31 and 32. For example, the first and second heatsinks 31 and 32 may be surrounded by the first electrode 41 and the insulating layer 20.

Thus, heat generated from the light emitting device 50 is transferred to the first heatsink 31 through the first electrode 41, and the heat transferred to the first heatsink 31 is transferred to the second heatsink 32 adjacent to the substrate 10 and the first heatsink 31. The heat transferred to the second heatsink 32 is effectively emitted to the outside through the first electrode 41.

The light emitting device 50 may be a light emitting diode (LED). The LED may have various structures such as a horizontal type and a vertical type.

The light emitting device 50 is electrically connected to the first electrode 41 and/or the second electrode 42 through a wire 51. In this embodiment, the light emitting device 50 has one side directly contacting the first electrode 41 and electrically connected to the first electrode 41. Also, the light emitting device 50 is electrically connected the second electrode 42 through the wire 51.

Also, the light emitting device 50 may be connected to the first electrode 41 and/or the second electrode 42 through a conductive via passing through the substrate 10. Alternatively, the light emitting device 50 may be connected to the first electrode 41 and/or the second electrode 42 using a flip chip manner.

The light emitting device 50 may be disposed on the first heatsink 31. Also, the light emitting device 50 may vertically overlap the first heatsink 31 to effectively transfer the heat emitted from the light emitting device 50 to the first heatsink 31.

A molding member 14 containing a phosphor may be disposed in the first cavity 11. Also, the molding member 14 may not contain the phosphor.

A method of manufacturing the light emitting device package according to an embodiment will be described in detail with reference to FIGS. 1 to 5.

Referring to FIG. 1, a substrate 10 is prepared. A top surface and a bottom surface of the substrate 10 are etched to first, second, and third cavities 11, 12, and 13.

A mask pattern may be formed on the substrate 10, and then, the substrate 10 may be selectively etched using the mask pattern as an etch mask to form the first, second, and third cavities 11, 12, and 13. For example, the mask pattern may be formed of silicon nitride.

The second cavity 12 and the third cavity 13 are used for forming a first heatsink 31 and a second heatsink 32. Here, only one of the second cavity 12 and the third cavity 13 may be formed.

Figure 2:
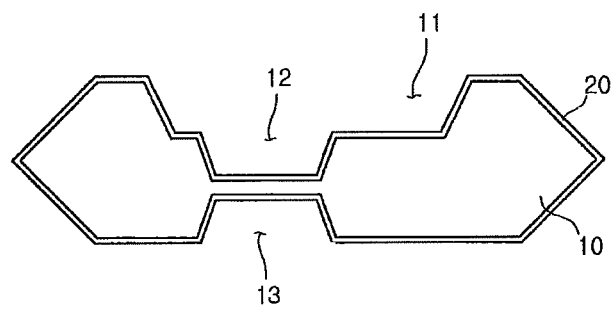

Referring to FIG. 2, an insulating layer 20 is formed on a surface of the substrate 10. The insulating layer 20 may include a Si oxide layer in which the substrate 10 formed of a Si material is oxidized.

Figure 3:
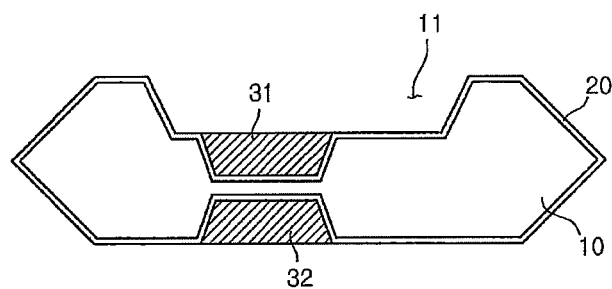

Referring to FIG. 3, the first heatsink 31 and the second heatsink 32 are formed in the second cavity 12 and the third cavity 13, respectively.

Seed layers may be formed in the second and third cavities 12 and 13, and then, a plating process may be performed on the seed layers to form the first and second heatsinks 31 and 32.

Alternatively, a metal may be deposited on the second and third cavities 12 and 13 to form the first and second heatsinks 31 and 32.

Since the substrate 10 is disposed between the second cavity 12 and the third cavity 13, the seed layers may be easily formed. Also, the first and second heatsinks 31 and 32 may be formed on the seed layers to reduce voids within the second and third cavities 12 and 13.

Referring to FIG. 4, a first electrode 41 and a second electrode 42, which are electrically separated from each other are formed on the substrate 10.

Since the first and second electrodes 41 and 42 extend from a bottom surface to a top surface of the substrate, the light emitting device package may be easily installed using a surface-mount technology.

The first and second electrodes 41 and 42 are formed on a bottom surface and lateral surfaces of the first cavity 11. Thus, the first electrode 41 may cover a top surface of the first heatsink 31. The first and second electrodes 41 and 42 may serve as a power supply function as well as a function that reflects light emitted from the light emitting device 50 to improve light efficiency.

Also, the first electrode 41 may contact the first heatsink 31 to effectively transfer the heat generated from the light emitting device 50 to the first heatsink 31.

Referring to FIG. 5, the light emitting device 50 is disposed on the first electrode 41. The light emitting device 50 and the second electrode 42 are electrically connected to each other using a wire 51.

Since the light emitting device 50 is formed on the first electrode 41, the heat generated from the light emitting device 50 may be effectively transferred to the first electrode 41 and the first heatsink 31.

As described above, in the light emitting device package and the method of manufacturing the same according to an embodiment, at least one of the second cavity 12 and the third cavity 13 is formed on the substrate 10 to form at least one of the first heatsink 31 and the second heatsink 32, which are formed of a metal material. Thus, the heat emitted from the light emitting device 50 may be quickly emitted to the outside using the first and second heatsinks 31 and 32.

Also, the first and second heatsinks 31 and 32 are vertically disposed with respect to the substrate 10 and vertically overlap each other. Thus, the heat may be effectively transferred between the first heatsink 31 and the second heatsink 32.

The method of manufacturing the light emitting device according to an embodiment may include etching a substrate 10 to form a cavity; forming a heatsink formed of a metal material within the cavity; forming first and second electrodes 41 and 42, which are electrically separated from each other on the substrate 10; and installing a light emitting device 50 on the substrate 10 to electrically connect the light emitting device 50 to the first and second electrodes 41 and 42.

The etching of the substrate 10 to form the cavity may include forming at least one of a second cavity 12 in a top surface of the substrate 10 and a third cavity 13 in a bottom surface of the substrate 10.

The etching of the substrate 10 to form the cavity may include forming a first cavity 11 in the top surface of the substrate 10 and forming the second cavity 12 within the first cavity 11.

The heatsink may include at least one of a first heatsink 31 buried in the second cavity 12 and a second heatsink 32 buried in the third cavity 13. The first heatsink 31 and the second heatsink 32 may vertically overlap each other.

Another embodiment provides a lighting system which comprises the light emitting device package described above. The lighting system may include lamp, street light, back light unit, not limited thereto.

Embodiments can provide the light emitting device package having a novel structure and the method of manufacturing the same.

Embodiments also can provide the light emitting device package having an improved thermal emission characteristic and the method of manufacturing the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a substrate;
a first metal on a top surface of the substrate;
a second metal under a bottom surface of the substrate; and
a light emitting device on the first metal,
wherein the substrate comprises a first portion between the first metal and the second metal and a second portion surrounding the first portion and extending from the first portion,
wherein the first portion has a narrower thickness than a thickness of the second portion and the first portion between the first metal and the second metal has no hole,
wherein an entire bottom surface of the first metal contacts the first portion, and
wherein a thickness of the second metal is greater than a thickness of the first portion.

2. The light emitting device package according to claim 1, wherein the first metal comprises aluminum.

3. The light emitting device package according to claim 1, wherein the second metal comprises copper.

4. The light emitting device package according to claim 1, wherein the substrate comprises an insulating member.

5. The light emitting device package according to claim 1, further comprising:
a phosphor layer around the light emitting device.

6. The light emitting device package according to claim 1, wherein the first metal comprises a first heat sink.

7. The light emitting device package according to claim 1, wherein the second metal comprises a second heat sink.

8. The light emitting device package according to claim 1, wherein the first metal is vertically overlapped with the second metal.

9. A light emitting device package comprising:
a substrate comprising a first portion between a first metal and a second metal and a second portion having thicknesses different from each other, the first portion having a narrower thickness than a thickness of the second portion, the first portion between a first metal and a second metal has no hole;
the first metal on a top surface of the first portion of the substrate;
the second metal under a bottom surface of the first portion of the substrate; and
a light emitting device on the first metal,
wherein an entire bottom surface of the first metal contacts the first portion, and
wherein a thickness of the second metal is greater than a thickness of the first portion.

10. The light emitting device package according to claim 9, wherein the second metal comprises aluminum.

11. The light emitting device package according to claim 9, wherein the second metal comprises copper.

12. The light emitting device package according to claim 9, further comprising:
a phosphor layer around the light emitting device.

13. The light emitting device package according to claim 9, wherein the first metal comprises a first heat sink and the second metal comprises a second heat sink.

14. The light emitting device package according to claim 9, wherein a distance between the first metal and the second metal is in a range from 10 μm to 20 μm.

15. A light emitting device package comprising:
a substrate;
an electrode on a top surface of the substrate;
a metal member under a bottom surface of the substrate; and
a light emitting device on the electrode,
wherein the substrate comprises a first portion between the electrode and the metal member and a second portion surrounding the first portion and extending from the first portion, wherein the first portion has a narrower thickness than a thickness of the second portion and the first portion between the electrode and the metal member has no hole, wherein an entire bottom surface of the electrode contacts the first portion, and wherein a thickness of the metal member is greater than a thickness of the first portion.

16. The light emitting device package according to claim 15, wherein the metal member comprises copper.

17. The light emitting device package according to claim 15, wherein the electrode comprises a first heat sink.

18. The light emitting device package according to claim 15, wherein the metal member comprises a second heat sink.

19. The light emitting device package according to claim 15, further comprising:

a phosphor layer around the light emitting device.

20. The light emitting device package according to claim 15, wherein the electrode extends from the first portion to the outside.

\* \* \* \* \*